(12) United States Patent
Anderson

(10) Patent No.: US 6,929,978 B2
(45) Date of Patent: Aug. 16, 2005

(54) METHOD OF FABRICATING AN INTEGRATED CIRCUIT PACKAGE UTILIZING A CONDUCTIVE STRUCTURE FOR IMPROVING THE BOND STRENGTH BETWEEN AN IC PACKAGE AND A PRINTED CIRCUIT BOARD

(75) Inventor: Sidney Larry Anderson, Fremont, CA (US)

(73) Assignee: Altera Corporation, San Jose, CA (US)

(*) Notice: Subject to any disclaimer, the term of this patent is extended or adjusted under 35 U.S.C. 154(b) by 31 days.

(21) Appl. No.: 10/219,173

(22) Filed: Aug. 13, 2002

(65) Prior Publication Data

US 2002/0194731 A1 Dec. 26, 2002

Related U.S. Application Data

(62) Division of application No. 09/517,799, filed on Mar. 2, 2000, now Pat. No. 6,462,414.
(60) Provisional application No. 60/126,234, filed on Mar. 24, 1999, and provisional application No. 60/123,116, filed on Mar. 5, 1999.

(51) Int. Cl.$^7$ ............................ H01L 21/44; H01R 43/16
(52) U.S. Cl. ...................... 438/108; 438/612; 438/613; 29/874
(58) Field of Search ...................... 29/825, 829, 830, 29/874, 884; 438/106–109, 612–615; 228/179.1, 180.21, 180.22

(56) References Cited

U.S. PATENT DOCUMENTS

| | | | | |
|---|---|---|---|---|
| 3,462,349 A | 8/1969 | Gorgenyi | .................... | 205/122 |
| 3,541,222 A | 11/1970 | Parks et al. | ................. | 174/68.5 |
| 4,652,336 A | 3/1987 | Andrascek et al. | ......... | 156/652 |
| 4,830,264 A | 5/1989 | Bitaillou et al. | ....... | 228/180.22 |

(Continued)

FOREIGN PATENT DOCUMENTS

| | | |
|---|---|---|
| DE | 197 02 014 A1 | 1/1997 |
| EP | 0 702 404 A2 | 3/1996 |
| EP | 0 751 565 A2 | 1/1997 |
| JP | 56 66057 | 6/1981 |
| JP | 64 41356 | 2/1989 |
| JP | 401120040 A | 5/1989 |
| JP | 06-112274 | 4/1994 |
| JP | 409266230 A | 10/1997 |
| JP | 2001 351946 | 12/2001 |
| WO | WO 92/00604 | 1/1992 |
| WO | WO 00/13232 | 3/2000 |

OTHER PUBLICATIONS

S.J. Kim et al., "A Study of High Density and Reliability BGA Package with Solder Ball Lands of Oval Type".

*Primary Examiner*—Alonzo Chambliss
(74) *Attorney, Agent, or Firm*—Townsend and Townsend and Crew LLP

(57) ABSTRACT

An integrated circuit package is provided with a ball landing area having a conductive structure for interlocking a conductive ball to the ball pad. The conductive structure improves the attachment strength between an integrated circuit package and an printed circuit board. In an exemplary embodiment, the locking structure is a conductive material added to the surface of the ball pad to provide a nonplanar interface, such as a dome or a step, which interlocks the conductive ball to the ball pad. The improved package construction increases the area of contact, moves the shear plane to a higher and larger portion on the conductive ball, and/or prevents a crack from propagating along a flat plane across the ball joint. This package construction maintains the small size of the ball land areas and the package, increases the life of the integrated circuit package, while offsetting the problem of package warpage.

30 Claims, 16 Drawing Sheets

U.S. PATENT DOCUMENTS

| | | |
|---|---|---|
| 5,053,851 A | 10/1991 | Berndlmaier et al. ........ 257/786 |
| 5,059,553 A | 10/1991 | Berndlmaier et al. ........ 438/614 |
| 5,203,075 A | 4/1993 | Angulas et al. ................ 29/830 |
| 5,260,518 A | 11/1993 | Tanaka et al. ............... 174/261 |
| 5,261,593 A | 11/1993 | Casson et al. ......... 228/180.22 |
| 5,317,801 A | 6/1994 | Tanaka et al. ................ 29/830 |
| 5,401,913 A | 3/1995 | Gerber et al. ............... 174/264 |
| 5,491,303 A | 2/1996 | Weiss ......................... 174/262 |
| 5,600,884 A | 2/1997 | Kondo et al. ................. 29/852 |
| 5,648,686 A | 7/1997 | Hirano et al. ............... 257/778 |
| 5,663,594 A | 9/1997 | Kimura ....................... 257/666 |
| 5,726,497 A | 3/1998 | Chao et al. .................. 257/758 |
| 5,757,078 A | 5/1998 | Matsuda et al. ............. 257/737 |
| 5,872,399 A | 2/1999 | Lee ............................. 257/738 |
| 5,943,597 A | 8/1999 | Kleffner et al. ............. 438/613 |
| 6,198,169 B1 | 3/2001 | Kobayashi et al. ......... 257/780 |
| 6,245,594 B1 | 6/2001 | Wu et al. .................... 438/108 |
| 6,400,018 B2 * | 6/2002 | Clatanoff et al. ........... 257/737 |
| 6,462,414 B1 * | 10/2002 | Anderson ................... 257/738 |

* cited by examiner

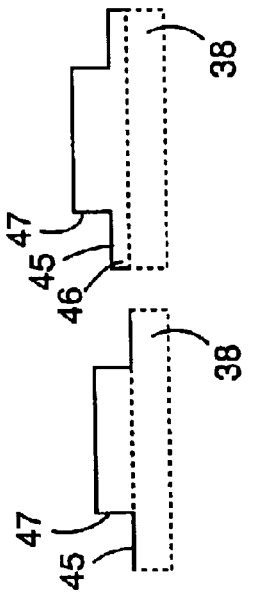
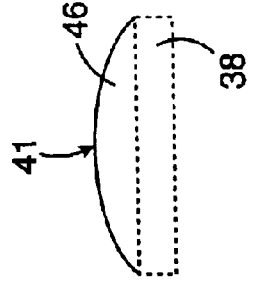
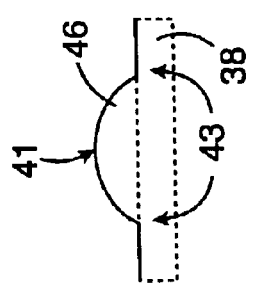
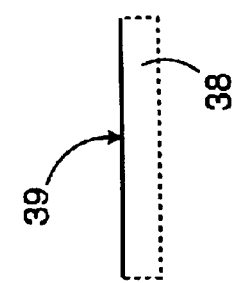
FIG. 6E
FIG. 6D
FIG. 6C
FIG. 6B
FIG. 6A

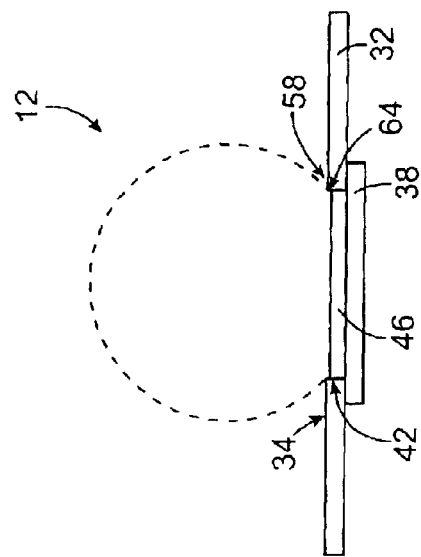
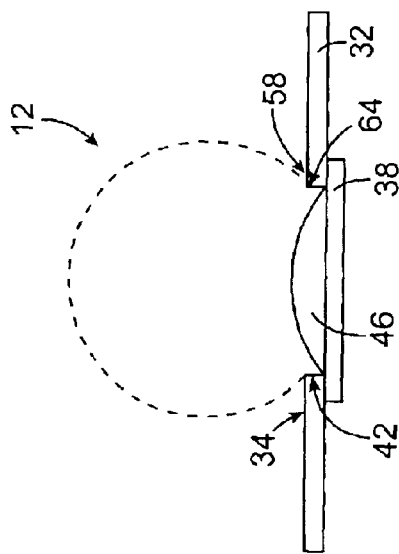
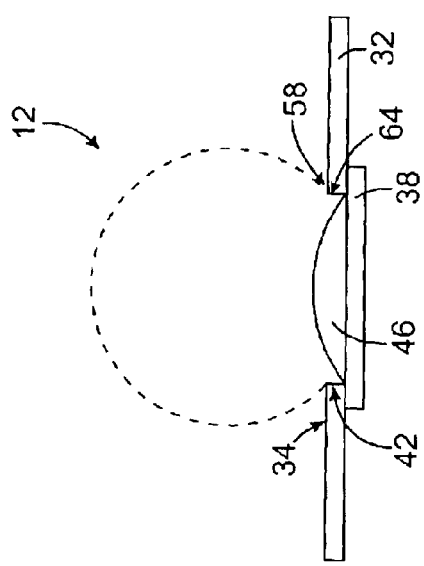

METHOD OF FABRICATING AN INTEGRATED CIRCUIT PACKAGE UTILIZING A CONDUCTIVE STRUCTURE FOR IMPROVING THE BOND STRENGTH BETWEEN AN IC PACKAGE AND A PRINTED CIRCUIT BOARD

CROSS-REFERENCES TO RELATED APPLICATIONS

This application is a divisional of U.S. patent application Ser. No. 09/517,799, filed Mar. 2, 2000, now U.S. Pat. No. 6,462,414; which claims priority to U.S. Provisional Patent Application No. 60/126,234, filed Mar. 24, 1999, which are incorporated by reference. This application is also related to U.S. Provisional Patent Application No. 60/123,116, filed Mar. 5, 1999, and U.S. Nonprovisional Patent Application No. 09/517,345, filed Mar. 2, 2000, non pending, which are incorporated by reference.

BACKGROUND OF THE INVENTION

The present invention relates to the field of integrated circuit substrates and packaging and more specifically to methods and devices which improve the reliability of conductive ball joints, especially when mounted on a printed circuit board.

Integrated circuits (ICs) or "chips" are becoming denser and are providing higher performance and functionality per unit area. Many ICs have hundreds of pads that will interface with the printed circuit board (PCB). The packaging for the IC seals the chip and connects the pads of the chip to the balls, pins, leads, or other electrical contacts of the package.

It is important that the IC package is relatively low in cost. Previous generations of IC packages were ceramic or included materials or used techniques that increased the cost of the packaging. It is also important that the IC packaging sufficiently protects the chip and provides the necessary number of electrical connections, and provides this function using as small a package size as possible. A package with a smaller footprint takes up less PCB space and more ICs can be mounted on a single PCB.

Another important consideration in IC packaging is reliability. One concern is that when an IC package is soldered or otherwise electrically connected to the PCB, the IC package should be reliably electrically connected to the PCB, or else over time open circuit or no connection failures will result. Because temperature cycling occurs when the IC heats up during operation, and cools off when not in operation, the solder connections between the IC and the PCB may be subjected to shear and stress forces as the package expands and contracts. The solder balls may work harden and then fracture. Consequently, cracks in the solder balls will cause open circuits, and ultimately system failure.

Therefore, as can be appreciated, methods and devices are needed to provide IC packaging with a lower cost, smaller package size, and better reliability. Specifically, there is a need to design integrated circuit packages which enhance solder ball reliability and longevity while maintain the small size of the package and large amount of contacts between the die and the PCB.

SUMMARY OF THE INVENTION

The present invention provides electronic devices, integrated circuit packages, and substrates having an improved conductive ball land area. The ball land area has a locking structure that improves the ball joint by interlocking the conductive ball lead to the land area on a substrate of the integrated circuit package. In one implementation, the locking structure is a conductive material added to the surface of the ball pad to provide a nonplanar or discontinuous interface, such as a dome or a step, which interlocks the conductive ball to the ball pad. "Nonplanar" is used throughout the specification to mean that the interface has more than minor surface variations and that the nonplanar interface substantially increases the area of contact, moves the shear plane to a higher and larger portion on the conductive ball, and/or prevents a crack from propagating along a flat plane across the ball joint, such that the nonplanar surface slows the movement of a crack across the conductive ball. This package construction maintains the small size of the ball land areas and the package, and increases the life of the integrated circuit package, while offsetting the problem of package warpage.

In one aspect, the present invention provides a substrate. The substrate has a dielectric layer having a via which extends between a first surface and a second surface of the dielectric layer. A conductive ball pad is positioned to permit electrical coupling through the via. A second portion of the conductive ball pad defines a nonplanar interface for a conductive ball and extends through the via toward a plane of the first surface.

In another aspect, the present invention provides a semiconductor package. The package includes a dielectric layer having a via which extends between a first surface and a second surface. A conductive pad is coupled to the second surface of the dielectric layer and is positioned to permit electrical coupling between a conductive lead and the conductive pad. A conductive structure is disposed over at least a portion of the conductive pad. An exposed surface of the conductive structure and any exposed surface of the conductive pad define a nonplanar interface which engages and interlocks the conductive lead. The nonplanar interface has a larger surface area than the area of the conductive pad.

In another aspect, the present invention provides a system for coupling an integrated circuit package to a printed circuit board. The system includes a conductive ball and a ball land area disposed on a substrate on the integrated circuit package. The substrate has a dielectric layer having a first surface, a second surface, a thickness extending between the first surface and the second surface, and a via that extends from the first surface to the second surface. A conductive layer is coupled to the second surface of the dielectric layer such that the via exposes a conductive ball pad of the conductive layer which permits electrical and mechanical coupling to the conductive ball. A plated up structure is disposed on the conductive ball pad and extends into the via. The plated up structure increases the shear strength of the interface by moving the shear plane to a larger portion of the conductive ball.

In yet another aspect, the present invention provides a method. The method includes the steps of providing a dielectric layer having a via. A portion of a conductive layer is exposed through the via in the dielectric layer. A conductive structure is added on the conductive layer to create a nonplanar interface which is exposed through the via.

In another aspect, the present invention provides a method of engaging a conductive lead. The method includes the steps of defining a land area on a substrate. A material is added to the land area to create a nonplanar interface between the conductive lead and the land area.

In yet another aspect, the present invention provides a method of fabricating a substrate. The method includes the steps of adding a conductive structure to a surface of a ball pad. A coating of photoresist is applied to the conductive structure. A desired portion of the photoresist is masked and the photoresist is exposed to a light source. Portions of the photoresist will be exposed to light and other portions will not be. Unwanted portion of the photoresist can be removed. The unwanted portion of the conductive structure underneath the removed photoresist is etched away and the remaining photoresist is removed.

In still another aspect, the present invention provides a method having the steps of providing a dielectric material having a via which exposes a ball bonding pad. A nonplanar conductive locking structure is then formed at the bonding pad. A conductive ball coupled to the ball bonding pad without the locking structure defines a shear plane, and the conductive ball coupled to the ball bonding pad having the nonplanar locking structure defines a shear interface which has a larger area than the shear plane.

In yet another aspect, the present invention provides a method having the steps of providing a printed circuit board and an integrated circuit having a ball bond pad which has a conductive ball locking structure with an exposed surface which limits the movement of a fatigue crack across the interface between the ball bond pad and a conductive ball. A conductive ball is interlocked between the printed circuit board and the integrated circuit.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 6A illustrates a planar interface between a conductive ball and a ball pad without a conductive locking structure;

FIGS. 6B to 6K illustrate some nonplanar interfaces of a ball pad having a conductive locking structure where the exposed surface is shown in solid lines and the unexposed portion of the conductive pad is shown in dotted lines;

FIGS. 7A to 7C are cross-sectional views of a three-layer tape having a punched via and conductive structures disposed within the via;

DETAILED DESCRIPTION

Figure 1A:
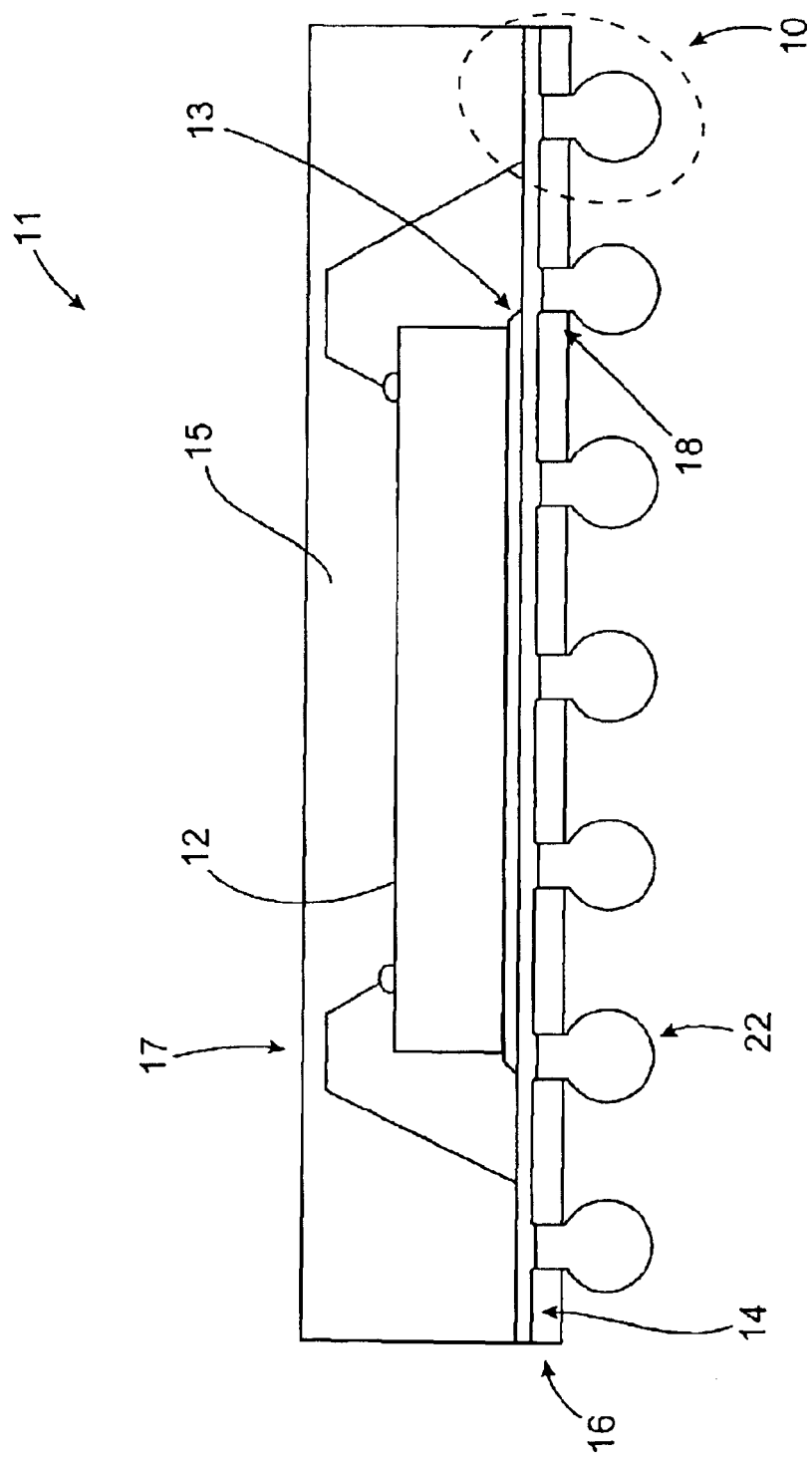
FIG. 1A illustrates a ball grid array package.

Ball Grid Array (BGA) packages meet the demand for integrated circuit packages having higher lead counts and smaller footprints. As shown in FIG. 1A, a BGA package 11 is typically a square or rectangular package having a die 12 which is adhered to a substrate with an adhesive 13 and is encapsulated with a molding compound 15. Bond wires 17 electrically couple the die to copper traces 16. The terminals of the BGA package are in the form of an array of conductive balls 22. Conductive balls 22 are connected to copper traces 16 through punched or etched vias 18 in a dielectric layer 14. Conductive balls can be any type of conductive material used to electrically connect and attach the package to the PCB. A solder ball is one type of conductive ball. The conductive ball terminals are designed to be mounted onto a plurality of ball lands (not shown) located on the surface of a printed circuit board (PCB) or other suitable substrates. Recently, BGA packages have been fabricated using tape automated bonding (TAB) processes and flexible circuitry, which typically includes copper traces on a thin polyimide substrate. The dielectric substrate and traces are often referred to as a "tape". Electrically conductive leads may be laminated on one or both sides of the TAB tape.

BGA packages and tape technology, however, do have some drawbacks. Potential problems include manufacturability and reliability problems due to cracks in the conductive balls or silicon die during package component assembly and reduced conductive ball contact life when mounted on the printed circuit board. Such problems or limitations arise when the coefficient of thermal expansion (CTE) of the packaging materials are sufficiently mismatched to a CTE of the silicon chip and a CTE of the PCB to which the component is mounted. This problem is commonly known as thermal mismatch stress. For example, the typical CTE of a silicon die can be as low as $2.6 \times 10^{-6}/°$ C. and that of a PCB can be as high as $17 \times 10^{-6}/°$ C. Accelerated temperature testing simulates the actual use of the device and varies the temperature from approximately 0°C. to 100° C. Tests have shown that the components of the integrated circuit package, i.e., the die, encapsulant and PCB, expand and contract at different rates. Specifically, the molding compound shrinks more than the die. And because the die typically sits at the bottom of the package, the top of the package tends to contract more than the bottom of the package, which curls the bottom of the package and pulls the outer edges of the package upward. This can lead to problems of delamination, cracking, shearing of the conductive balls, and inevitably to system failure. One type of failure is known as an "electrical open" where any one of the conductive balls is no longer electrically connected to the PCB or package.

Figure 1B:
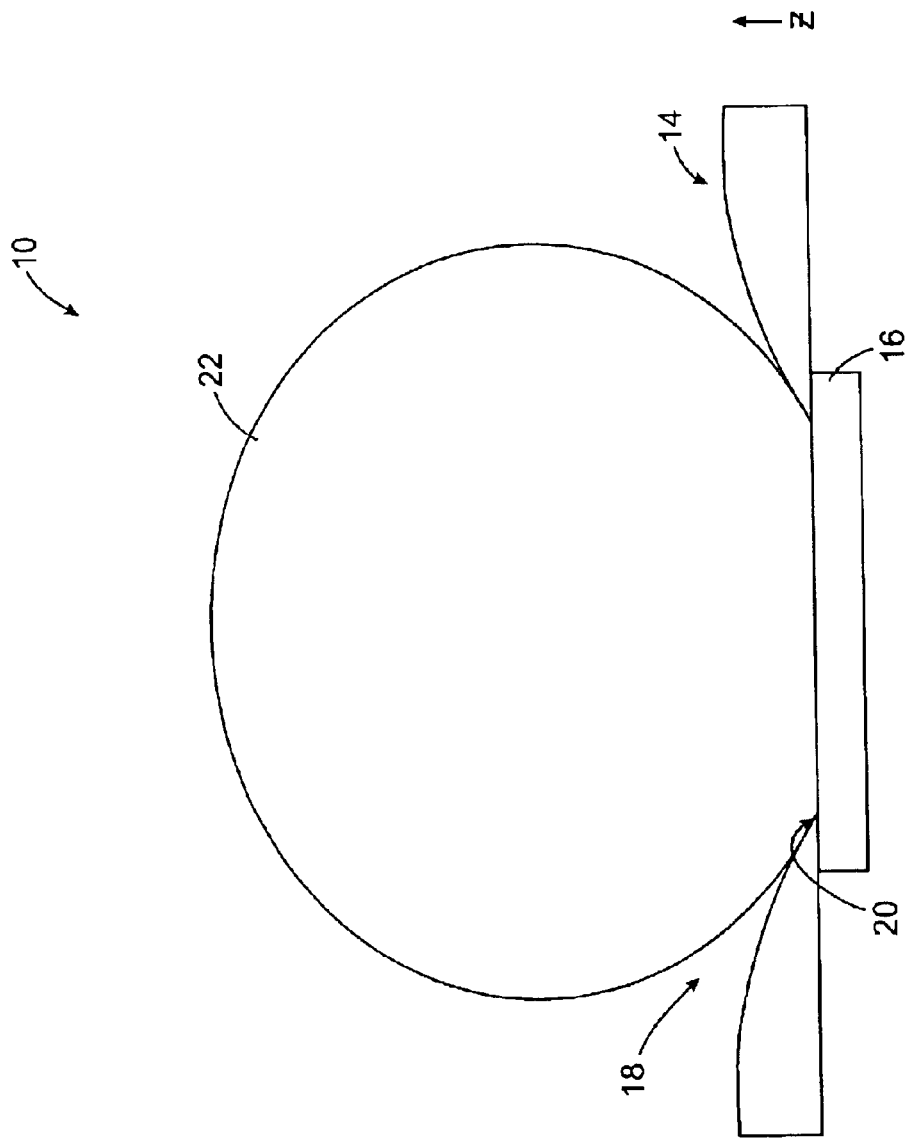
FIG. 1B illustrates a conductive ball land of the ball grid array package.
Figure 2:
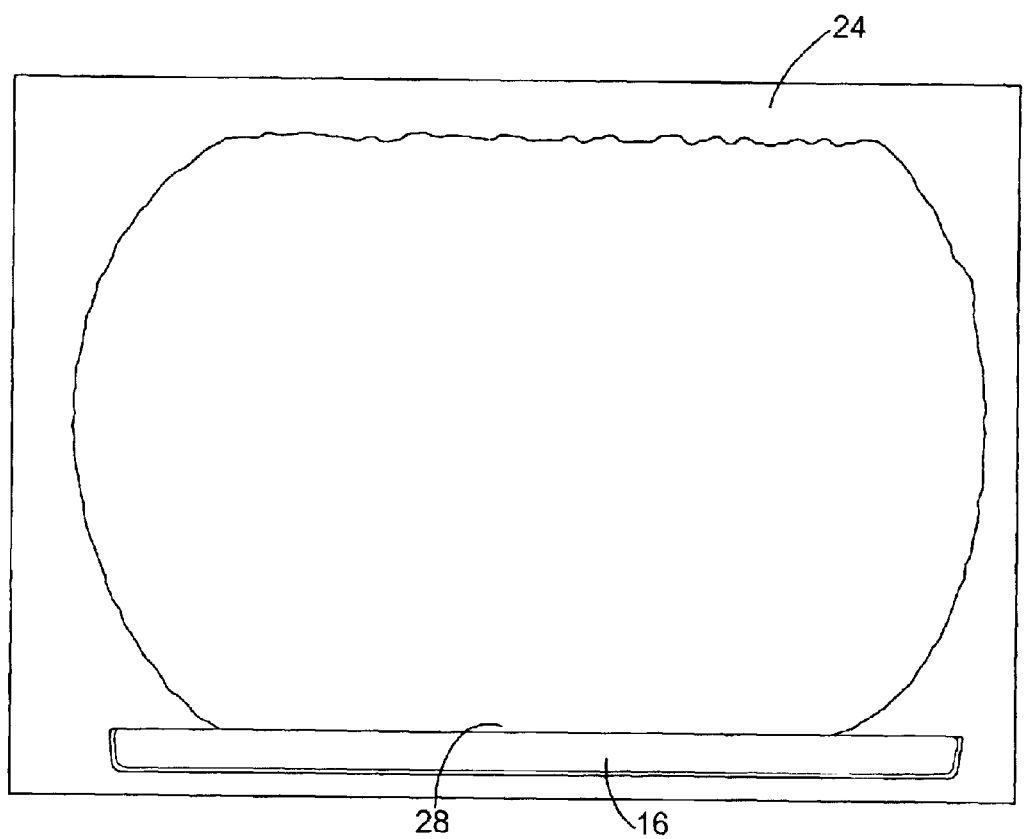
FIG. 2 is cross-sectional view of a conductive ball and a conductive ball land area prior to temperature cycling.
Figure 3:
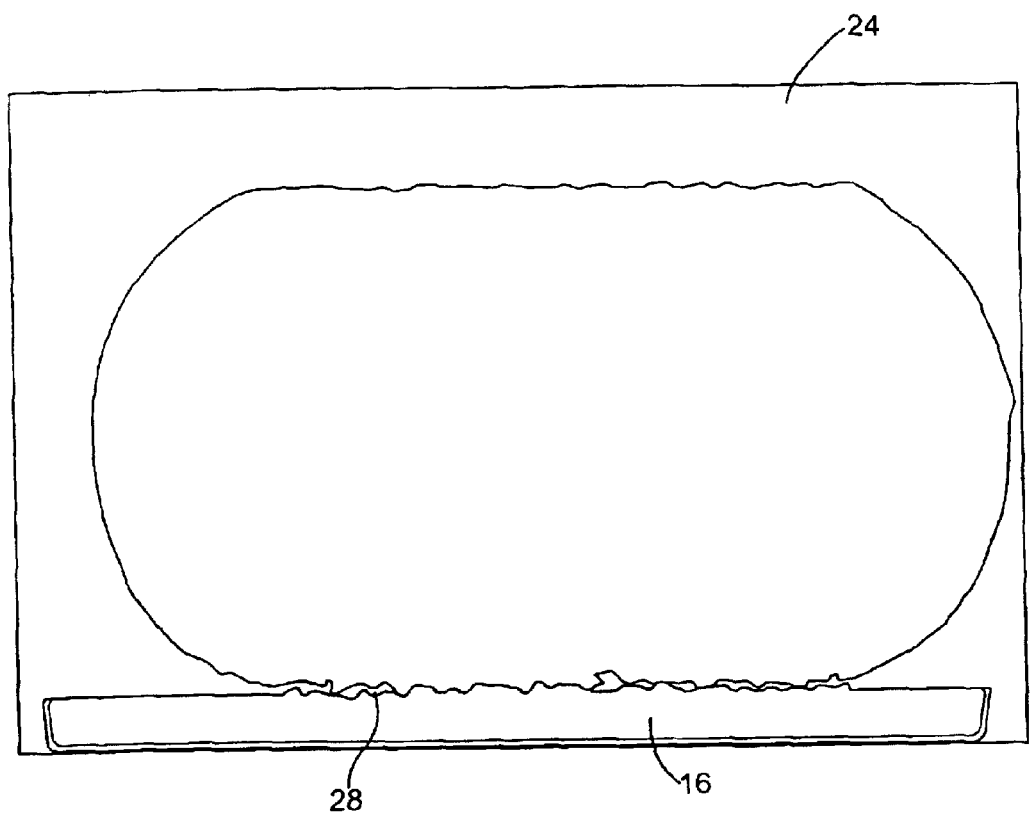
FIG. 3 is a cross-sectional view of the conductive ball and the conductive ball land area of FIG. 2, after temperature cycling.

FIGS. 1B to 3 show cross-sectional views (section 10 of FIG. 1A) of an integrated circuit package with a conductive ball land area 16. The conductive ball land area 16 typically includes an insulting dielectric layer or tape 14 connected to a conductive layer. Conductive traces (not shown) extend between the ball land areas and the bond pads. A via 18 formed in the dielectric layer 14 exposes conductive ball pad 20. Prior to temperature cycling, as shown in FIG. 2, conductive ball 22 electrically and mechanically connects a printed circuit board 24 to the integrated circuit package. After temperature cycling, as illustrated in FIG. 3, the expansion and contraction of the package from the CTE mismatch causes stress. That stress typically shears through the conductive ball 22 along a shear plane at the interface 28 between the conductive ball 22 and the conductive layer 16. Such a breakage leads to electrical and mechanical failure of the conductive ball and ultimately to a system failure.

Consequently, the design of the conductive ball land area is important for determining the reliability of the conductive ball joint. An industry standard is to have the conductive ball joints maintain electrical continuity for least two thousand failure-free temperature cycles (from 0° Celsius to 100° Celsius). For example, this standard is used for IC packages in the telecommunication market and other industries.

One technique to address this problem is to use bigger conductive balls to increase the conductive ball joint strength. The conductive ball joint between a bigger conductive ball and a PCB has a larger cross-sectional area, and subsequently provides a larger shear plane. A drawback, however, is that the bigger conductive balls require larger conductive ball land areas. This increases the size of the package for the same number of conductive balls. For the same package size, however, this reduces the potential number of contacts between the die and the PCB and detrimentally limits the total amount of leads on the circuit.

Another technique to address this problem is to use taller conductive balls. The conductive ball joint between the taller conductive ball and the PCB is stronger because the distance between the limiting point of expansion (i.e., the die with its CTE as low as $2.6 \times 10^{-6}/°$ C.) and the PCB is increased. This reduces the stress between the ball and the conductive ball landing area. Currently the only way to achieve the taller ball is by increasing the size of the ball, which requires a larger ball land, as described above.

The present invention is especially important for integrated circuit packages for high pin count devices such as microprocessors, gate arrays, FPGAs, PLDs, ASICs, and others. For example, a specific application of the present invention is for packaging of Altera Corporation's FLEX®, APEX®, or MAX® lines of PLDs. The package may be a tape ball grid array, which is used for Altera's 10 K family of Fine Line™ and SameFrame™ products, or similar arrays. The methods of the present invention would also improve the reliability of lower pin count packages such as semiconductor memories, SRAMs, DRAMs, Flash EPROMs, and the like. The package may be of varying sizes such as, but not limited to, 11 millimeters, 17 millimeters, 23 millimeters, 27 millimeters, and 33 millimeter package outlines. Moreover, the packages can have pin counts of, 100, 256, 484, 672, 1020, or the like. The packages may also be overmolded with conventional transfer molding techniques.

To form a ball grid array, conductive leads or balls, such as solder balls, are attached to a flexible tape to make electrical and mechanical contact with individual ball pads through vias in the dielectric layer. Typically, the conductive balls are substantially spherical or oval in shape and have a diameter from about 12 mils to about 30 mils. Conductive balls are typically attached using conventional reflow techniques such as infrared, laser, convection, or vapor phrase. In one embodiment, the conductive balls are composed of a 63 percent tin and 37 percent lead. Naturally, it will be appreciated that the conductive ball can be any size and composed of any suitable conductor, including but not limited to, other tin-lead compositions, Pb—Ag—In compositions, lead, silver, tin, zinc, or the like. In other embodiments, the balls may be lead-free.

As shown in FIG. 1B, the conductive ball lands 10 typically have a dielectric layer 14 overlaying a conductive layer 16. Dielectric layer 14 typically has a thickness between 2 mils and 3 mils, and is comprised of a patternable dielectric material suitable for insulating the conductive layer. Such materials include, but are not limited to polyimide, polyester, ceramic, glass, FR-4, or BT. The conductive layer 16 typically has a thickness between about 0.5 mil and 1 mil. The conductive layer 16 may include conductive materials such as tungsten, titanium, conductive adhesives, aluminum, aluminum alloys, copper, copper alloys, gold, nickel, silver, and others. The dielectric layer and the conductive layer are usually formed as part of a two-layered or three-layered tape formed from any of a variety of flexible circuit tape, flex circuit, or the like.

The distance between the conductive ball lands, or the conductive ball pitch, typically varies between 0.5 mil and 1.27 mils. The conductive ball pad, (e.g. the area of the conductive layer that receives the conductive ball) is typically composed of copper having a nickel and gold overlay. Naturally, it will be appreciated that the dimensions and other physical characteristics of the conductive ball land areas may vary significantly depending on the format and size of the integrated circuit and/or the particular format of a conductive ball pitch of the package. A wide range of materials, compositions, and geometric shapes and sizes may be utilized for the conductive ball land pad while still obtaining the benefits of the present invention. For example, the conductive ball pads can be comprised of any conductive material, such as aluminum, aluminum alloys, copper alloys, gold, silver, or the like.

Figure 4:
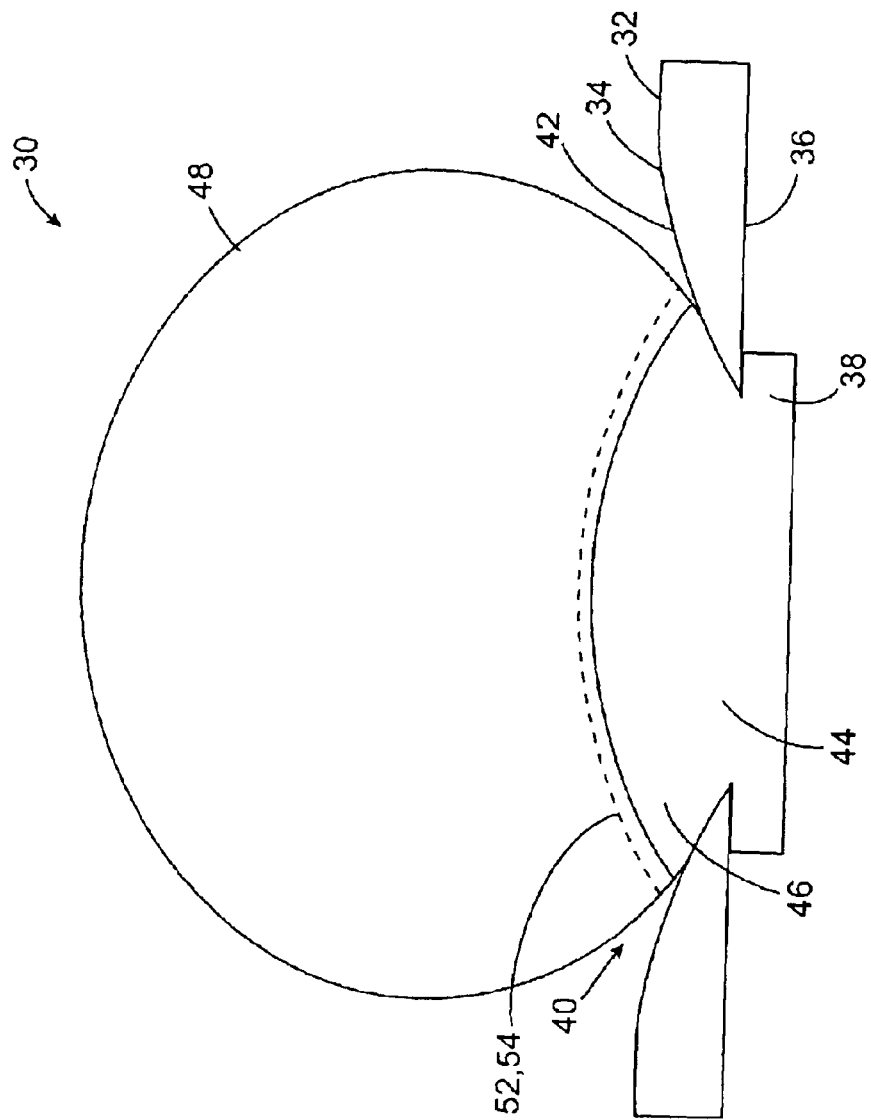
FIG. 4 illustrates an exemplary conductive ball land area incorporating the present invention.
Figure 5:
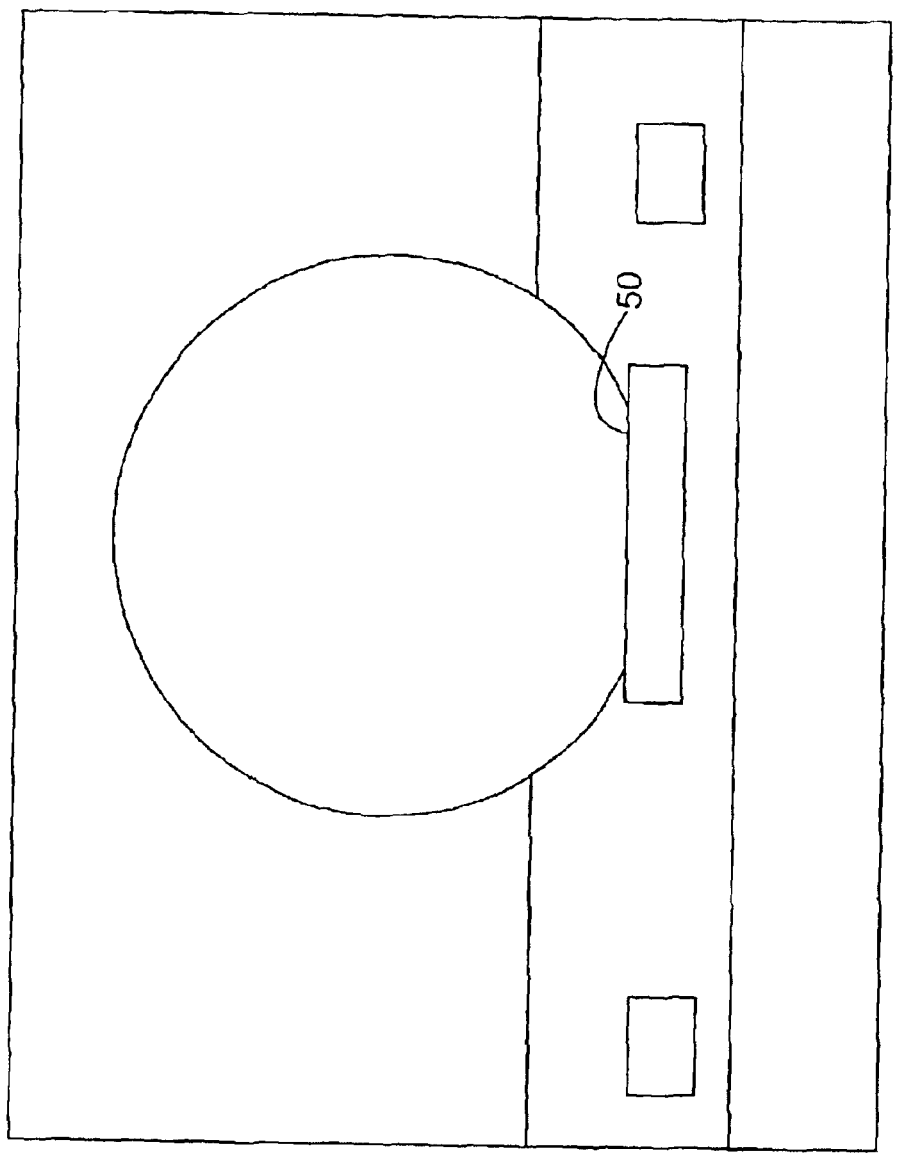
FIG. 5 is a cross-sectional view of the conductive ball land area of FIG. 4.

FIGS. 4 and 5 illustrate an exemplary embodiment of a ball land area of an integrated circuit package 30 of the present invention. The integrated circuit package 30 has a dielectric layer 32 having a first surface 34 and a second surface 36. A conductive layer 38 is coupled to the second surface 36 of the dielectric layer. A via 40 is patterned in the dielectric layer to form a third surface 42 which extends between the first surface 34 and the second surface 36. A first portion of the conductive layer or a conductive ball pad 44 is exposed through the via 40. A second portion of the conductive layer or conductive structure 46 is added to the conductive ball pad 44.

The conductive structure 46 is attached to the planar conductive ball pad 44 and may cover only a portion of the conductive ball pad, but alternatively may completely cover the conductive ball pad. The added conductive structure 46 extends in the Z-direction into the via 40 to provide a nonplanar or discontinuous interface which electrically and mechanically connects the conductive ball 48 to conductive layer 38. The conductive structure 46 can increase the strength of the conductive ball bond by increasing the area of contact between the conductive ball and the conductive ball pad, by moving the shear plane upwards to a larger area of conductive ball 48 and/or preventing a crack from propagating along a planar interface 50 between the conductive layer and the bottom of the conductive ball. By achieving any of the above functions, the locking structure slows the propagation of the crack across the conductive ball and increases the lifespan of the electrical bond.

Shaped conductive structure 46 can be added directly to the conductive ball pad 44 to add material in the Z-direction. Conductive structure 46 can be the same material as the conductive ball pad 44 or different material than the conductive ball pad. In one embodiment both the conductive ball pad 44 and conductive structure 46 are composed of electroplated copper. Conductive structure 46, can also be composed of various conductive metals such as copper alloys, aluminum, nickel, gold, or the like. When copper is added to the conductive ball pad 44, by electroplating or plating, the added copper is grown radially in a dome shape. Thus, the center of the conductive structure 46 is thicker and plates faster than the sides of the conductive structure. While the above description generally provides a conductive structure attached to the first portion of the conductive layer, the present invention is not limited to such a structure. For example, the conductive structure can actually be nonconductive or can be mounted to the dielectric layer. The important aspect of the "locking" structure is that the added material interlocks the conductive ball and improves the strength of the connection between the conductive ball and the integrated circuit package.

To create a locking structure, conductive material is added to the conductive layer. Adding conductive material also generally provides the benefit of increasing the current handling capacity of the conductive layer. While it is possible to etch back the conductive layer to interlock the conductive ball instead of adding material to the ball pad, etching or reducing the conductive layer does not provide the same current handling capacity.

Figure 6H:
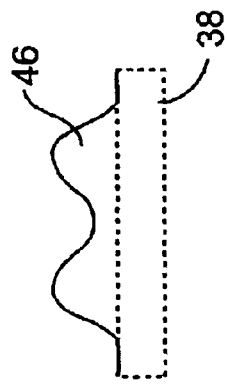
Figure 6K:
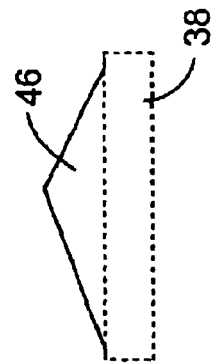
Figure 6G:
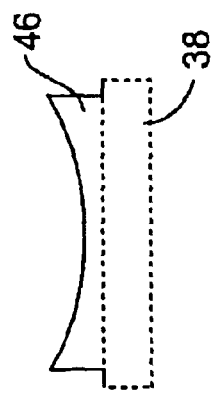
Figure 6J:
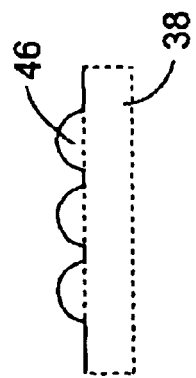
Figure 6F:
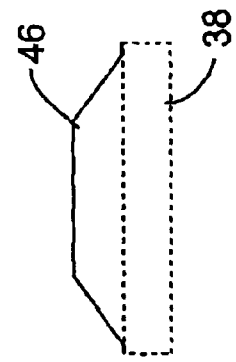
Figure 6I:
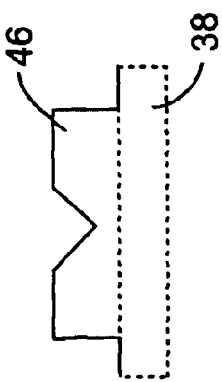

In most embodiments, the conductive structure (i.e. the second portion) defines a nonplanar interface which engages and interlocks the conductive ball to the ball pad. As shown in FIG. 6A, for ball pads 38 without a conductive locking structure, the interface between the ball pad and the conductive ball defines a planar first surface area 39. Any crack forming in the conductive ball will generally propagate directly across the planar surface. As shown in FIGS. 6B to 6E, the interface includes the exposed surface 41 of the conductive structure and any surface 43 of the conductive layer that is not covered by the conductive structure 46. The nonplanar interface of the conductive structure 46 limits the movement of the fatigue crack along the plane and forces the crack to move in a nonplanar fashion. For example, as shown in FIGS. 6D and 6E, the crack will initially continue along planar surface 45 until it reaches surface 47. Once the crack reaches surface 47, the crack will be stopped or forced to propagate nonplanarly around surface 47. Moreover, as shown in FIGS. 6B and 6C, for the hemispherical or dome shaped conductive structures 46, the fatigue crack is forced to move in a longer, curved path through the conductive ball. Accordingly, for all embodiments of the locking structure of the present invention, it will take the crack longer to propagate across the conductive ball and the reliability of the electrical contact will be improved since the locking structure will prevent electrical open failures for a greater number of temperature cycles.

It should be noted that the shape of the conductive structure is not as important as the increase in material to the conductive ball pad and the creation of a nonplanar interface between the conductive layer and the conductive ball. For example, as shown in FIGS. 6A to 6K the shape of the conductive structure can be discontinuous, sloped, wavy, curved, hemispherical, circular, cylindrical, square, oval, a step, or the like. Moreover, multiple conductive structures can be disposed on the conductive ball pad. Additionally, the conductive structure may be masked and chemically or mechanically etched to remove portion of the conductive structure.

The conductive layer is typically overlayed with layers of gold 52, nickel 54, or both since conductive balls 22 adhere well to gold and nickel. Thus, as illustrated in FIG. 4, instead of adding the gold layer and nickel layers to the first portion of the conductive ball pad 44, the gold layer and nickel layers can be added over the conductive structure 46 and in between conductive structure 46 and conductive ball pad 44 to improve the interlocking bond to the conductive ball.

The equator of the conductive ball is typically where the conductive ball has the largest cross-sectional area. While it is desirable to move the conductive structure and shear plane to the largest area of the conductive ball, in most implementations the conductive structure does not extend that far. For example, as shown in FIG. 5, the locking structure typically extends only to the top plane of the substrate. During manufacturing of the package, the die is typically attached to the substrate with the substrate positioned on a flat surface. If the conductive structure extends out of the via past the plane of the substrate, the substrate would likely be positioned unevenly over the flat surface. The uneven orientation of the substrate and die increases the stress concentration on the die and increases the chance of cracking the die. Notwithstanding the above, it is contemplated that in other manufacturing methods, the conductive structure 46 may extend up to the equator of the conductive ball 22.

FIGS. 7A to 7C show exemplary implementations of a conductive ball land 12 using a conventional three-layer tape with punched vias 58. This structure includes a three-dimensional construction that takes advantage of the BGA fabrication technology. The three layer tape is typically formed by bonding the dielectric layer 32 to the patterned conductive circuit layer 38 using an adhesive (not shown). The dielectric layer 32 and adhesive will typically undergo a stamping or punching operation suitable for integrated circuit packaging to form the vias. After vias 58 are formed, conductive structure 46 can be plated or electroplated onto conductive layer 38. Conductive structure 46 is typically added to the middle of the conductive ball pad and plated up in the Z-direction to aid the interlocking of conductive ball 48 to conductive land 46. Conductive structure 46 adds to the area to the land for the conductive ball 48 to attach. In most embodiments, the conductive structure 46 does not extend beyond the plane of the first surface 34 of the dielectric layer.

Corners 64 of the conductive ball land area can be a high stress point, and fractures or other failures often occur at these points. An inside angle of corner 64 is approximately 90 degrees and is formed by the first surface 34 and third surface 42 meeting at an edge. As will be described below, it is often beneficial to chemically etch the third surface so as to reduce the high stress points. Nonetheless, even with the high stress point, the conductive structure still improves the shear strength of the conductive ball joint by approximately fifty percent over conventional conductive ball land areas.

Figure 8A:
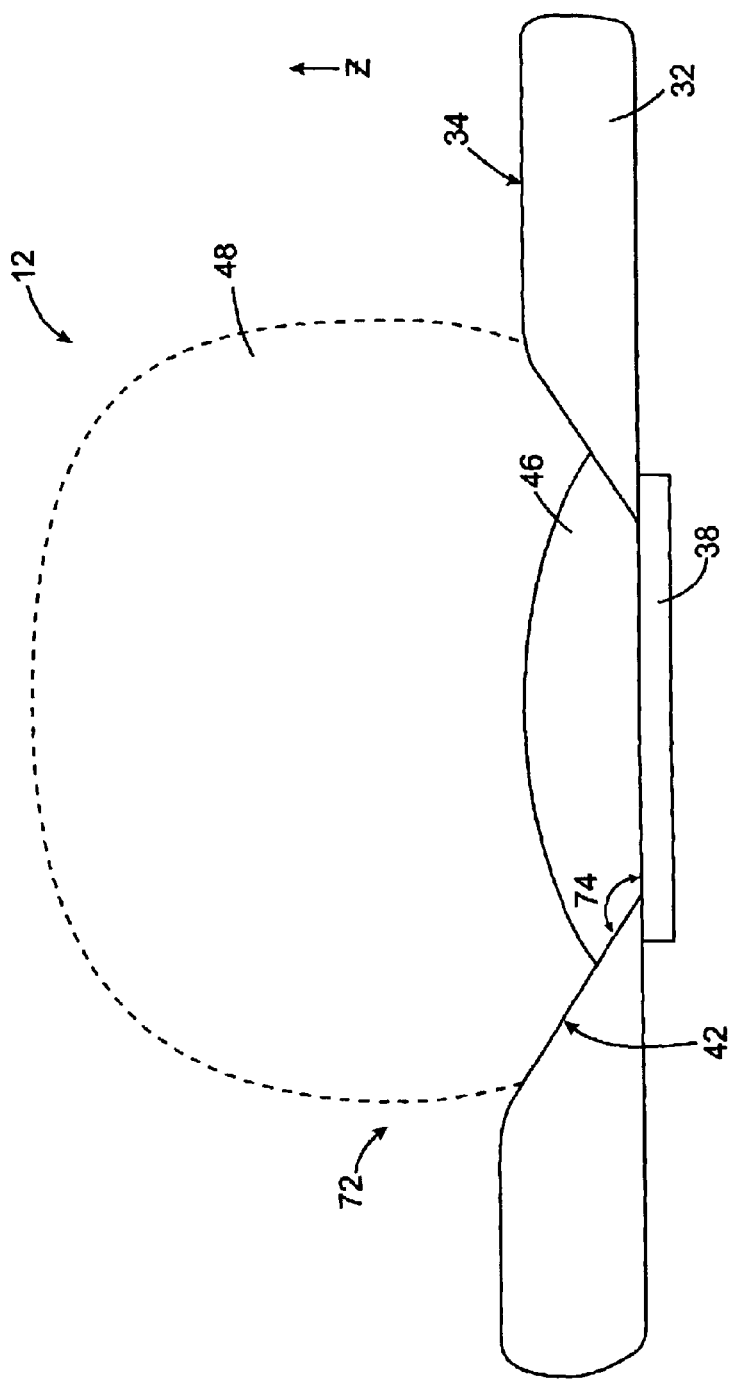
FIG. 8A is a view of a chemically etched conductive ball pad.
Figure 8B:
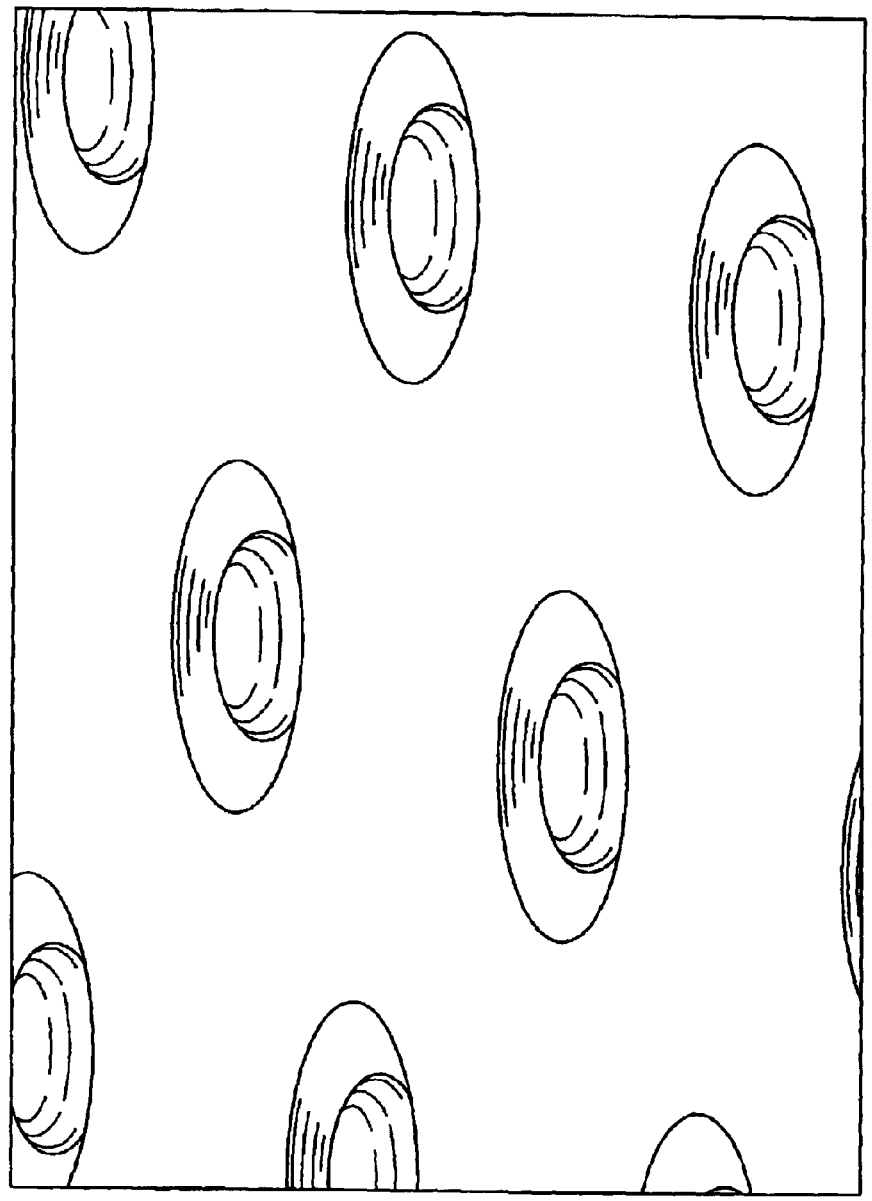
FIG. 8B is a perspective view of an integrated circuit package comprising a plurality of conductive ball land areas having a conductive structure.

FIGS. 8A and 8B show another exemplary implementation of a conductive ball land area 12. This conductive ball land is fabricated using a two-layer tape 70 having chemically etched vias 72. (FIG. 8A). Chemically etched, two-layer tape is manufactured by 3M®. In this embodiment, the third surface 42 of the chemically etched via extends at an angle 74 from the second surface to the first surface. The angled sidewalls of the via improve the conductive ball joint by eliminating the stress point that is typically found with conventional punched tapes. In some implementations, the corner may be curved or scalloped. As shown in FIG. 8B, the conductive structure 46 is typically added to the middle of the conductive ball pad 44 in the Z-direction to aid the interlocking of the conductive ball 48 to the conductive land 44. As the conductive structure 46 is added, a portion of the conductive structure may cover a portion of the dielectric layer or the conductive structure may be contained entirely on the conductive structure. The plating up of the conductive structure 46 forms a dome-like structure over the conductive ball pad and tends to form away from the third surface 42 of the dielectric layer 32.

Figure 9:
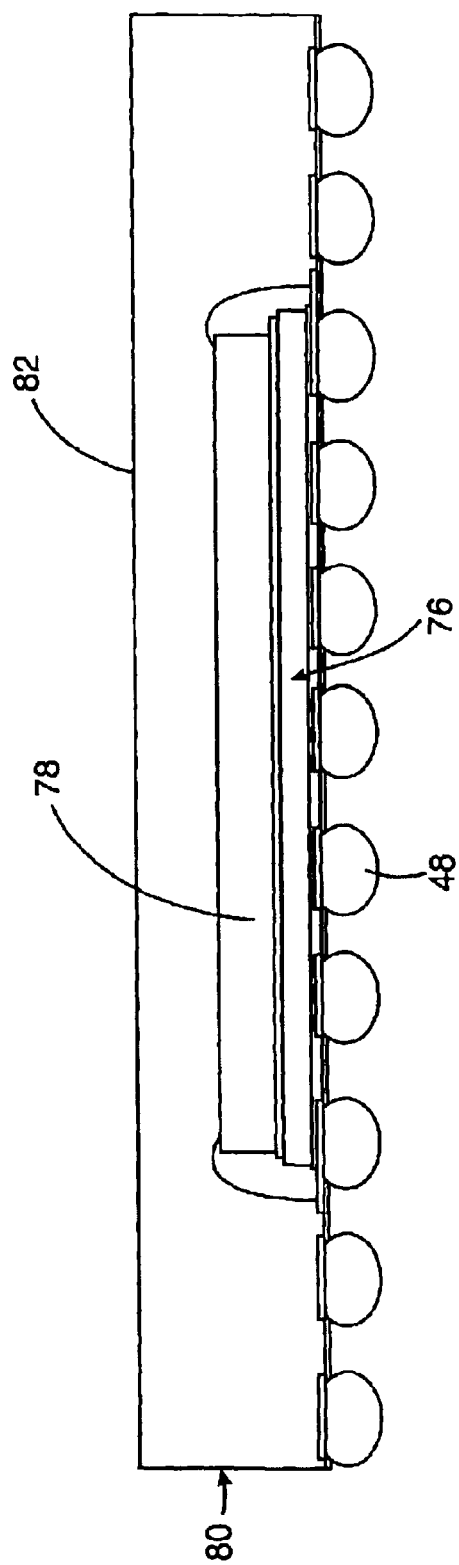
FIG. 9 illustrates a integrated circuit package having a transition medium disposed between the die and the dielectric layer.

FIG. 9 illustrates another aspect of the present invention. A stress relief transition medium 76 can be disposed beneath the plastic encapsulated die 78 to further alleviate the rocking and warpage effect from the die packaging. The transition medium 76 moves the die 78 toward the middle of the package 80 and farther away from the conductive balls 48. By having the die 78 towards the middle of the package, warpage, and curling are reduced since the top of the die and the bottom of the die retract and expand at similar rates. To achieve the similar expansion and retraction, the transition medium 76 material should have the same coefficient of thermal expansion (CTE) as the molding compound 82. The transition medium material typically has a coefficient of thermal expansion which is similar to that of the molding compound, which is typically between approximately $7 \times 10^{-6}/°$ C. and $17 \times 10^{-6}/°$ C., and preferably between $7 \times 10^{-6}/°$ C., and $12 \times 10^{-6}/°$ C. For example, the transition medium can be FR-5 (a material used in some printed circuit boards), the molding compound (or similar molding compound materials), an elastomer, an adhesive, or the like. The stress relief transition medium and related methods are described in copending U.S. patent application Ser. No. 09/517,345, filed Mar. 2, 2000, the full disclosure of which was previously incorporated by reference.

Figure 10:
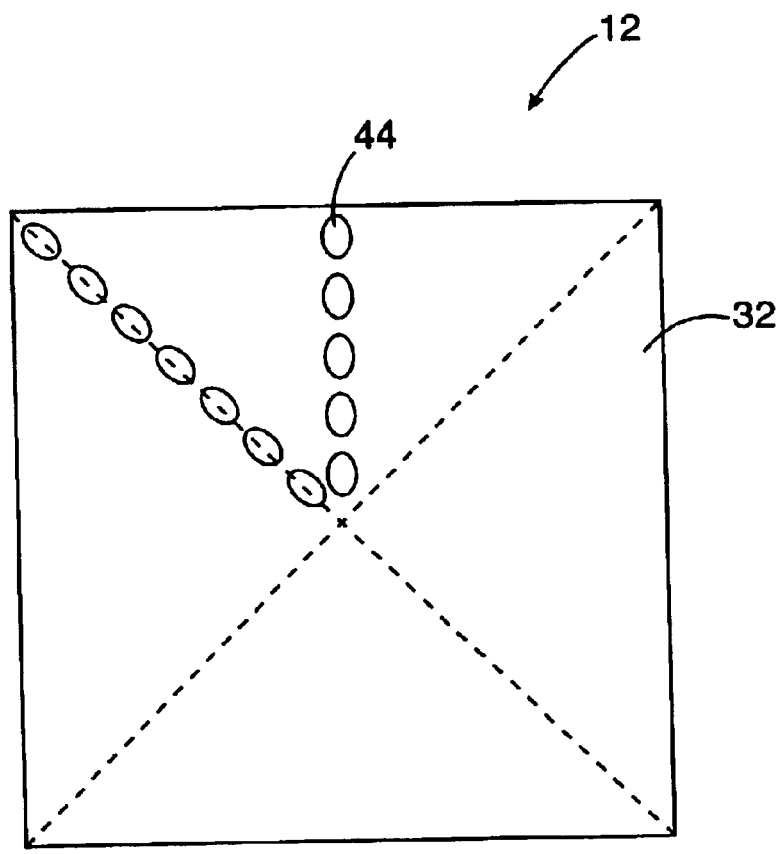
FIG. 10 is a plan view of an integrated circuit package having oval conductive ball pads with the major axis of the pads oriented toward the center of the package.

FIG. 10 illustrates yet another aspect of the present invention. Instead of having the conductive ball lands being circular, it is possible to have the conductive ball pads oval shaped. The oval shapes have a better shear strength than circular shaped conductive ball land pads and allow more traces between adjacent conductive ball pads. Because the stress from the integrated circuit package has been found to radiate from the center of the package it is preferable that the major axis of the conductive ball land pad be oriented toward the center of the package. As above, each of the oval conductive ball land pads can have a conductive structure disposed on the pad to improve the interlock between the conductive ball and the conductive ball pad.

To fabricate the conductive land area of the present invention various methods can be used. A plating-up step is applied after initial circuit fabrication and before final plating of the circuit land with the nickel layer and the gold layer. The method of the present invention permits additional build-up plating to be applied to the conductive ball land area to enhance the construction topography and area of the plated conductive ball land. A construction of this type has been modeled to show about a two-fold improvement in conductive ball fatigue life when the component is mounted to the printed circuit board.

Figure 11A:
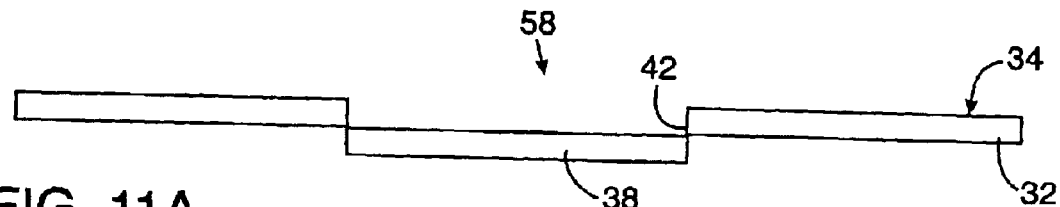
FIGS. 11A–11D illustrate an exemplary method of the present invention.
Figure 11B:
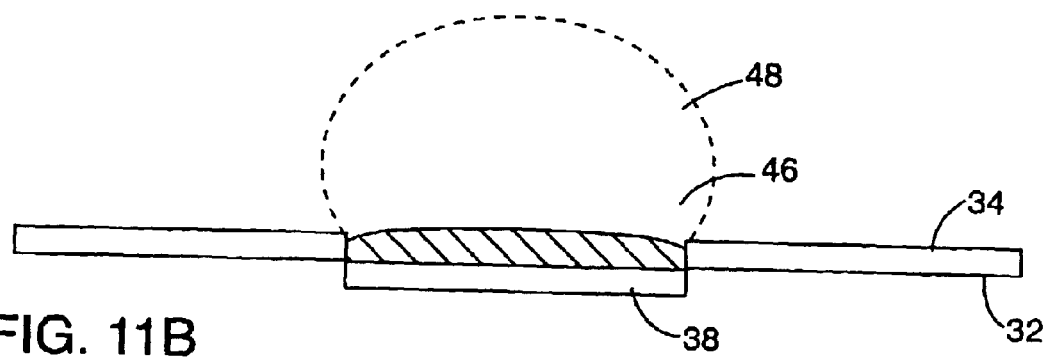
Figure 11C:
Figure 11D:
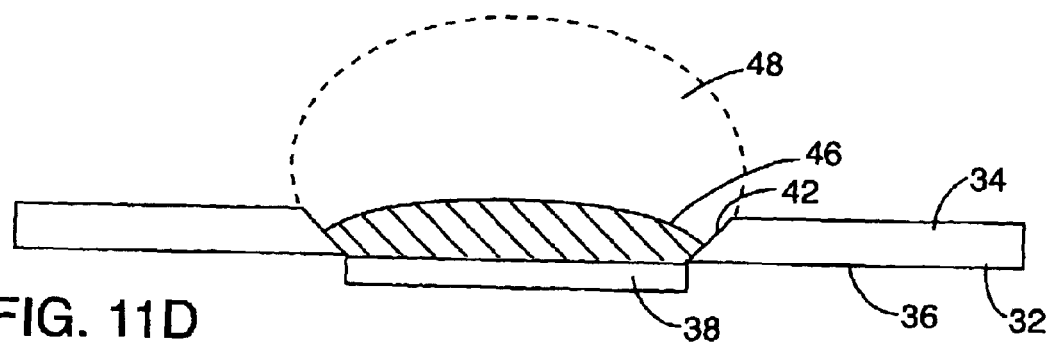

Referring now to FIGS. 11A to 11D, a dielectric layer 32 and a conductive layer 38 are coupled to a nonactive side of a die or wafer (not shown) using conventional methods such as adhesive. The conductive layer 38 is patterned to form a circuit pattern and the dielectric layer 32 is attached to the surface of the conductive layer 38. As illustrated in FIGS. 11A and 11C, a via 40 can be punched or chemically etched in the dielectric layer 32, respectively, either before or after attachment to the conductive layer 38 using conventional methods to expose a first portion of the conductive ball pad 44. Thereafter, as shown in FIGS. 11B and 11D the conductive structure 46 (i.e. a second portion) is added to the conductive layer 38. The conductive structure 46 mechanically and electrically connects the conductive ball 48 to the conductive layer 38. The conductive structure 46 can be the same material or a different material from the conductive layer 38. In the embodiments of FIGS. 11B and 11D, the conductive structure 46 contacts the third surface 42 of the dielectric layer and the conductive ball 48 does not directly contact the conductive pad 44. Thus, the electrical and mechanical connection between the conductive ball and conductive ball conductive layer 38 is entirely through the conductive material 46. However, it will be appreciated that in other embodiments, the conductive structure 46 does not completely cover the conductive layer 38 and the conductive ball 48 can contact a surface of the conductive layer 38.

Figure 12A:
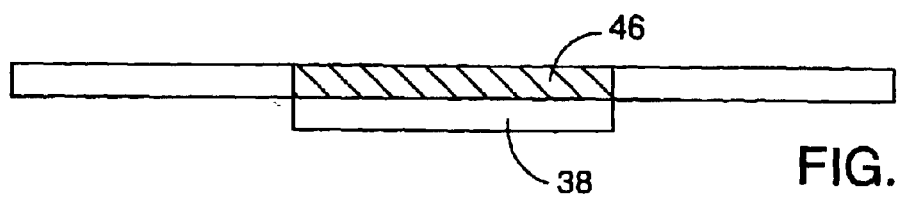
FIGS. 12A–12F illustrate another exemplary method of the present invention.
Figure 12B:
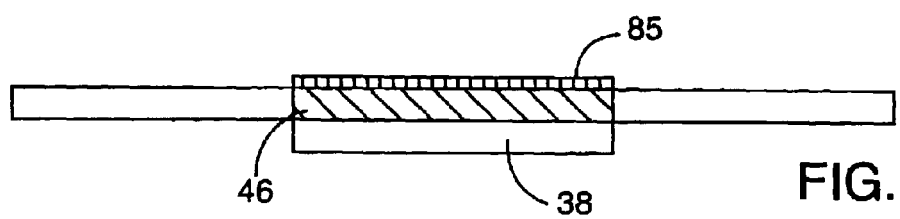
Figure 12C:
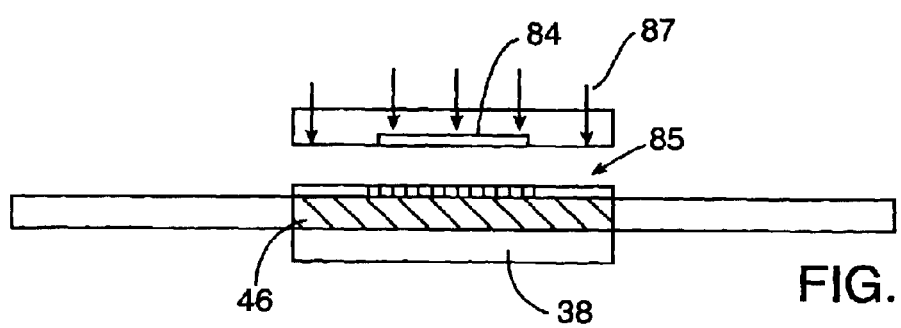
Figure 12D:
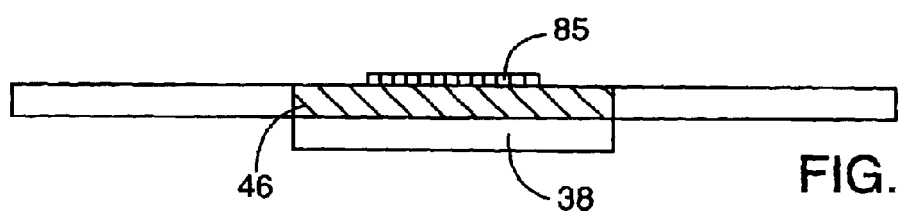
Figure 12E:
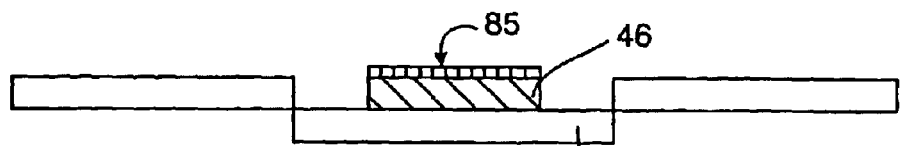
Figure 12F:
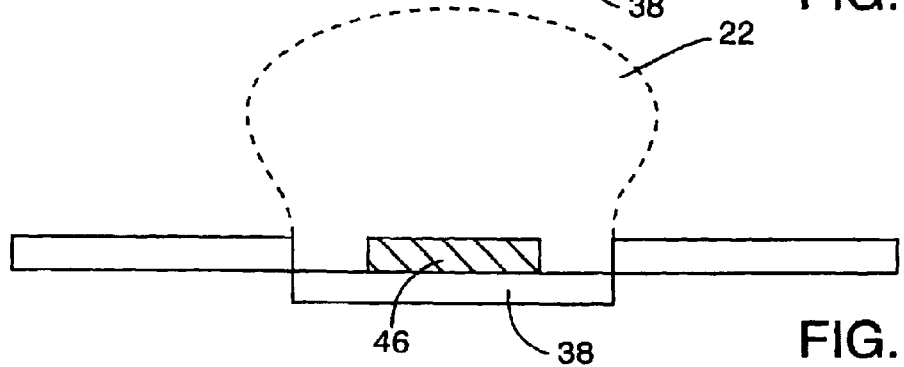

FIGS. 12A–12F illustrate a second method of the present invention. In this embodiment, a mask 84 and photoresist 85 are used to shape the conductive structure 46. As shown in FIG. 12A, the conductive structure 46 is either evaporated, sputtered, deposited, alloyed, or otherwise added to the conductive ball pad 38. FIG. 12B illustrates the photoresist 85 being applied using conventional methods such as precision spraying, roller coating, spinning, or dip coating, so that the surface of the conductive structure 46 has a substantially uniform coat of photoresist. Typically, the photoresist is exposed through a mask 84 by a high intensity ultraviolet light 87. As shown in FIG. 12C, if the photoresist is "positive," any portion exposed to the light is removed. As shown in FIG. 12D, the photoresist is then developed using conventional methods such as immersion, spraying, or puddling, to remove the exposed portion of the photoresist. Thereafter, as shown in FIG. 12E, the conductive structure 46 is etched using conventional methods such as dry plasma etching, wet etching, or chemical etching. The photoresist 85 is then removed and the conductive ball is seated on the conductive ball pad (FIG. 12F). Naturally, it will be appreciated that "negative photoresist" (i.e. any portion not exposed to the light is removed) can be used in place of positive photoresist. The mask and photoresist provide a low-cost process which can simultaneously involve many chips per wafer and many wafers per evaporation. The conductive ball 48 normally contacts both the conductive layer 38 and the conductive structure 46. Here, the conductive structure 46 does not contact the third surface of the dielectric layer and the plating material forms a centered cylinder which extends in the Z-direction from the conductor pad.

Figure 13A:
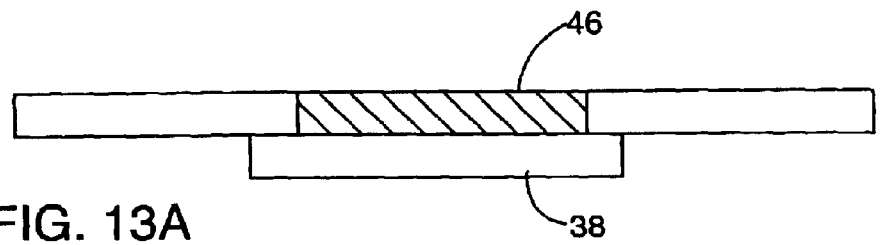
FIGS. 13A–13C illustrate yet another exemplary method of the present invention.
Figure 13B:
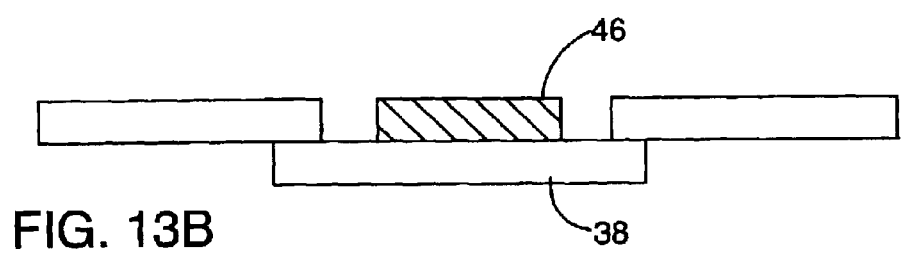
Figure 13C:
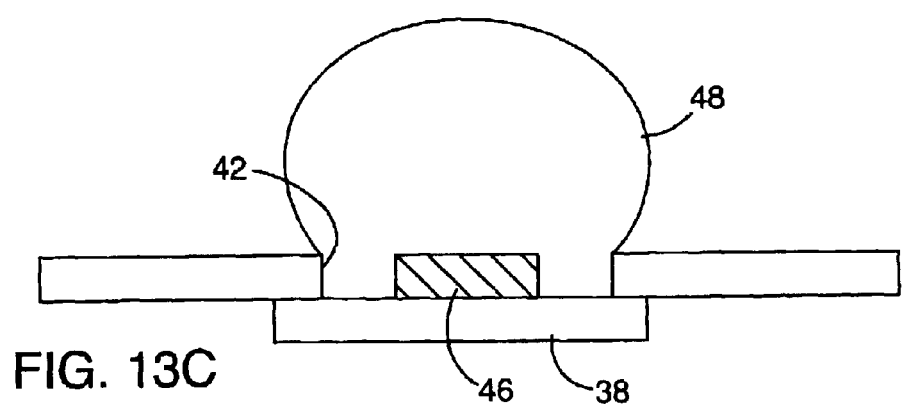

FIGS. 13A–13C illustrate yet another method of the present invention. As shown in FIG. 13A, the conductive structure 46 is formed on the conductive ball pad 44. Using conventional methods, specific portions of the conductive structure 46 are etched away (FIG. 13B). In the embodiment shown in FIG. 13C, the outer portion of the conductive structure 46 contacting the third surface 42 of the dielectric layer 32 is etched away and a centered conductive structure is left intact. A conductive ball 48 can then be seated over the conductive structure 46 and the conductive ball pad 44 to mechanically and electrically couples the integrated circuit package to a printed circuit board (not shown).

This description of embodiments of the invention is presented for the purposes of illustration and description. It is not intended to be exhaustive or to limit the invention to the precise form described, and many modifications and variations are possible in light of the description above. The embodiments were chosen and described in order to best explain the principles of the invention and its practical applications. This description of embodiments will enable others skilled in the art to best utilize and practice the invention in various embodiments and with various modifications as are suited to the particular use contemplated. It is intended that the scope of the invention be defined by the following claims.

What is claimed is:

1. A method comprising:
   providing a dielectric layer having a via, a first surface of the dielectric layer exposed in the via;
   exposing a portion of a conductive layer through the via in the dielectric layer, the conductive layer contacting a second surface of the dielectric layer;
   adding a conductive material to the portion of the conductive layer to create a nonplanar interface that is exposed through the via, wherein the conductive material has a curved upper surface having a plurality of curved peaks that are defined by valleys with respect to an upper surface of the conductive layer; and
   adding a conductive ball to the nonplanar interface of the conductive material.

2. The method of claim 1 wherein the nonplanar interface is discontinuous.

3. The method of claim 1 wherein the conductive layer is planar.

4. The method of claim 1 wherein the nonplanar interface has a larger surface area than the conductive layer exposed through the via.

5. The method of claim 1 wherein the nonplanar interface includes the conductive material and an exposed portion of the conductive layer not covered by the conductive material.

6. The method of claim 1 wherein the adding step completely covers the portion of the conductive layer exposed through the via.

7. The method of claim 1 comprising the step of seating a conductive ball on the nonplanar interface.

8. The method of claim 7 wherein the nonplanar interface prevents a crack from propagating substantially planarly through the conductive ball.

9. The method of claim 7 wherein the conductive ball couples a printed circuit board to a integrated circuit package.

10. The method of claim 7 comprising directly contacting the conductive ball with a portion of the conductive layer.

11. The method of claim 1 wherein the adding step is carried out by plating up copper directly on the conductive layer.

12. The method of claim 1 wherein the adding step is carried out with a mask and photoresist.

13. The method of claim 1 further comprising etching away a portion of the nonplanar interface.

14. The method of claim 13 wherein the etching step is carried out through photolithography.

15. The method of claim 1 wherein the via is formed by mechanically punching the dielectric layer.

16. The method of claim 1 wherein the via is formed by chemically etching the dielectric layer.

17. The method of claim 1 wherein the conductive material is a different material than the conductive layer.

18. The method of claim 1 wherein the via extends away from the conductive layer at an angle.

19. The method of claim 1 further comprising plating at least one of the conductive layer and the conductive material with a layer of gold, nickel, or silver.

20. A method of engaging a conductive lead comprising:
   providing a conductive land area that has an upper surface on substrate;
   providing a dielectric layer having a via, wherein the dielectric layer has a lower surface, an upper surface, and a third surface exposed in the via, and wherein the upper surface of the conductive land area is coupled to the lower surface of the dielectric layer;
   adding conductive material to the upper surface of the conductive land area, wherein the conductive material has a plurality of hemispherical regions that are exposed in the via; and
   adding a conductive ball to the curved surface of the conductive material.

21. The method of claim 20 wherein a portion of the conductive land area in between the hemispherical regions is not covered by the conductive material.

22. The method of claim 20 wherein the conductive material has a three hemispherical regions.

23. A method of fabricating a substrate comprising:
   adding a conductive structure to a surface of a conductive ball pad in between a via in a dielectric layer;
   defining the conductive structure to form a surface of the conductive structure that has a trapezoidal shape; and
   adding a conductive ball to the surface of the conductive structure.

24. A method comprising:
   providing a dielectric material coupled to a surface of a ball bonding pad, the dielectric layer having a via to the ball bonding pad; and
   forming at the surface of the ball bonding pad a nonplanar locking structure electrically coupled to the ball bonding pad, wherein the nonplanar locking structure has an inverted triangular cross section.

25. The method of claim 24 wherein the nonplanar locking structure is formed by electroplating a conductive material to the ball bonding pad.

26. The method of claim 24 wherein the forming step is carried out by defining the conductive ball locking structure using lithography.

27. A method comprising:
   providing a printed circuit board and an integrated circuit package having a dielectric layer that has a via and a ball bond pad that has a ball locking structure, the ball locking structure having an exposed surface that limits the movement of a fatigue crack across the interface between the ball bond pad and a conductive ball, and the exposed surface of the ball locking structure has a triangular cross section; and
   interlocking the conductive ball between the printed circuit board and the integrated circuit package.

28. The method of claim 27 wherein the interlocking step is carried out by increasing the area of the shear plane of the conductive ball.

29. The method of claim 27 wherein the conductive ball locking structure is formed by adding material to the ball bond pad.

30. The method of claim 27 wherein the interlocking step is carried out by preventing a crack from propagating planarly across the conductive ball.

* * * * *